United States Patent
Shimatani

(10) Patent No.: US 7,551,111 B2
(45) Date of Patent: Jun. 23, 2009

(54) DECODER CIRCUIT, DRIVING CIRCUIT FOR DISPLAY APPARATUS AND DISPLAY APPARATUS

(75) Inventor: Atsushi Shimatani, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/898,017

(22) Filed: Sep. 7, 2007

(65) Prior Publication Data
US 2008/0062021 A1    Mar. 13, 2008

(30) Foreign Application Priority Data
Sep. 8, 2006    (JP) .............................. 2006-243887

(51) Int. Cl.
*H03M 1/66*    (2006.01)
(52) U.S. Cl. ....................... 341/144; 341/118
(58) Field of Classification Search ................. 341/133, 341/144, 135, 136, 153

See application file for complete search history.

(56) References Cited

U.S. PATENT DOCUMENTS

| | | | | |
|---|---|---|---|---|
| 6,617,989 B2 * | 9/2003 | Deak | ........................... | 341/144 |
| 6,639,534 B2 * | 10/2003 | Khoini-Poorfard et al. | .. | 341/144 |
| 6,853,323 B1 * | 2/2005 | Chen et al. | ................... | 341/144 |

FOREIGN PATENT DOCUMENTS

JP     2002-043944    2/2002

* cited by examiner

*Primary Examiner*—Brian Young
(74) *Attorney, Agent, or Firm*—McGinn IP Law Group, PLLC

(57) ABSTRACT

A decoder circuit configured to output an analog voltage signal according to input digital data includes an operational amplifier, first selection circuit and compensation unit. The operational amplifier includes a plurality of input differential pairs and generates an output voltage by interpolating input voltages applied to the plurality of input differential pairs. The first selection circuit selects the input voltages applied to the plurality of input differential pairs from reference voltages according to the digital data. The compensation unit suppresses a fluctuation in a transient variation characteristic of the input voltages applied to the plurality of input differential pairs depending on a selection of the input voltages by the first selection circuit in case at least one voltage level among the reference voltages is changed.

20 Claims, 13 Drawing Sheets

| GRAY-SCALE LEVEL | VD1 | VD2 | SW 1 | SW 2 | SW 3 | SW 4 | SW 5 | SW 6 | SW 7 | SW 8 | SW 9 | SW 10 | SW 11 | SW 12 | VIN 1 | VIN 2 | VIN 3 | $VS_k$ $= (VIN1+VIN2$ $+2*VIN3)/4$ |
|---|---|---|---|---|---|---|---|---|---|---|---|---|---|---|---|---|---|---|
| n | $VR_i$ | $VR_{i+1}$ | ON | ON | ON | OFF | OFF | OFF | OFF | OFF | OFF | ON | ON | ON | VD1 | VD1 | VD1 | $VR_i$ |
| n+1 | $VR_i$ | $VR_{i+1}$ | ON | OFF | ON | OFF | ON | OFF | OFF | OFF | OFF | ON | OFF | ON | VD1 | VD1 | VD2 | $(3VR_i+VR_{i+1})/4$ |
| n+2 | $VR_i$ | $VR_{i+1}$ | ON | ON | OFF | OFF | ON | ON | OFF | OFF | ON | ON | ON | OFF | VD1 | VD2 | VD1 | $(2VR_i+2VR_{i+1})/4$ |
| n+3 | $VR_i$ | $VR_{i+1}$ | ON | OFF | OFF | OFF | ON | ON | ON | ON | ON | OFF | OFF | OFF | VD1 | VD2 | VD2 | $(VR_i+3VR_{i+1})/4$ |
| n+4 | $VR_{i+2}$ | $VR_{i+1}$ | OFF | OFF | OFF | OFF | ON | ON | OFF | OFF | ON | OFF | OFF | OFF | VD2 | VD2 | VD2 | $VR_{i+1}$ |
| n+5 | $VR_{i+2}$ | $VR_{i+1}$ | ON | OFF | OFF | OFF | ON | OFF | OFF | OFF | ON | ON | OFF | OFF | VD1 | VD2 | VD2 | $(VR_{i+2}+3VR_{i+1})/4$ |
| n+6 | $VR_{i+2}$ | $VR_{i+1}$ | ON | ON | OFF | OFF | OFF | OFF | OFF | OFF | OFF | ON | OFF | OFF | VD1 | VD1 | VD2 | $(2VR_{i+2}+2VR_{i+1})/4$ |
| n+7 | $VR_{i+2}$ | $VR_{i+1}$ | ON | OFF | ON | OFF | OFF | OFF | OFF | OFF | OFF | ON | ON | ON | VD1 | VD2 | VD1 | $(3VR_{i+2}+VR_{i+1})/4$ |
| n+8 | $VR_{i+2}$ | $VR_{i+3}$ | ON | ON | ON | OFF | OFF | OFF | OFF | OFF | OFF | ON | ON | ON | VD1 | VD1 | VD1 | $VR_{i+2}$ |

Fig. 5

RELATED ART

RELATED ART

| GRAY-SCALE LEVEL | IMAGE DATA $D_k$ | | | | | | | | | | VD1 | VD2 | VIN1 | VIN2 | VIN3 | $VS_k$ = (VIN1+VIN2+2*VIN3)/4 |
|---|---|---|---|---|---|---|---|---|---|---|---|---|---|---|---|---|
| | BIT 9 | BIT 8 | BIT 7 | BIT 6 | BIT 5 | BIT 4 | BIT 3 | BIT 2 | BIT 1 | BIT 0 | | | | | | |
| 0 | 0 | 0 | 0 | 0 | 0 | 0 | 0 | 0 | 0 | 0 | $VR_0$ | $VR_1$ | VD1 | VD1 | VD1 | $VR_0$ |
| 1 | 0 | 0 | 0 | 0 | 0 | 0 | 0 | 0 | 0 | 1 | $VR_0$ | $VR_1$ | VD1 | VD1 | VD2 | $(3VR_0+VR_1)/4$ |
| 2 | 0 | 0 | 0 | 0 | 0 | 0 | 0 | 0 | 1 | 0 | $VR_0$ | $VR_1$ | VD1 | VD2 | VD1 | $(2VR_0+2VR_1)/4$ |
| 3 | 0 | 0 | 0 | 0 | 0 | 0 | 0 | 0 | 1 | 1 | $VR_0$ | $VR_1$ | VD1 | VD2 | VD2 | $(VR_0+3VR_1)/4$ |
| 4 | 0 | 0 | 0 | 0 | 0 | 0 | 0 | 1 | 0 | 0 | $VR_2$ | $VR_1$ | VD2 | VD2 | VD2 | $VR_1$ |
| 5 | 0 | 0 | 0 | 0 | 0 | 0 | 0 | 1 | 0 | 1 | $VR_2$ | $VR_1$ | VD1 | VD2 | VD2 | $(VR_2+3VR_1)/4$ |
| 6 | 0 | 0 | 0 | 0 | 0 | 0 | 0 | 1 | 1 | 0 | $VR_2$ | $VR_1$ | VD1 | VD2 | VD1 | $(2VR_2+2VR_1)/4$ |
| 7 | 0 | 0 | 0 | 0 | 0 | 0 | 0 | 1 | 1 | 1 | $VR_2$ | $VR_1$ | VD1 | VD1 | VD2 | $(3VR_2+VR_1)/4$ |
| 8 | 0 | 0 | 0 | 0 | 0 | 0 | 1 | 0 | 0 | 0 | $VR_2$ | $VR_3$ | VD1 | VD1 | VD1 | $VR_2$ |
| ... | ... | ... | ... | ... | ... | ... | ... | ... | ... | ... | ... | ... | ... | ... | ... | ... |
| 1022 | 1 | 1 | 1 | 1 | 1 | 1 | 1 | 1 | 1 | 0 | $VR_{256}$ | $VR_{255}$ | VD1 | VD1 | VD2 | $(2VR_{256}+2VR_{255})/4$ |
| 1023 | 1 | 1 | 1 | 1 | 1 | 1 | 1 | 1 | 1 | 1 | $VR_{256}$ | $VR_{255}$ | VD1 | VD2 | VD1 | $(3VR_{256}+VR_{255})/4$ |

Fig. 11

DECODER CIRCUIT, DRIVING CIRCUIT FOR DISPLAY APPARATUS AND DISPLAY APPARATUS

BACKGROUND OF THE INVENTION

1. Field of the Invention

The present invention relates to a decoder circuit used in a driving circuit of a liquid crystal display panel or the like. More particularly, the present invention relates to a decoder circuit that is able to selectively output a voltage from gray-scale voltages corresponding to the number of gray-scale levels in input digital data by generating voltages for interpolating reference voltages smaller in the number of the gray-scale levels.

2. Description of Related Art

A decoder circuit used in a driving circuit of a liquid crystal display panel converts digital image data input externally into an analog signal to supply to a signal line of the liquid crystal display panel. If digital data input to the decoder circuit is 10 bits, for example, such decoder circuit must be able to generate an output signal of $2^{10}$ (1024) ways of voltage levels.

A decoder circuit in general is configured to select one reference voltage corresponding to input digital data from several reference voltages generated by dividing between highest-level and lowest-level reference voltages by a ladder resistance and supply the selected reference voltage to a signal line of a liquid crystal panel via a buffer amplifier (voltage follower). However, with progress in growth of a number of gray-scale levels and higher-resolution of liquid crystal displays, there is a problem in the configuration to generate reference voltages corresponding to the number of all gray-scale levels in the input digital data by a ladder resistance of increasing the size of a decoder circuit and driving circuit including the decoder circuit.

Therefore, a decoder circuit is suggested for generating reference voltages smaller in the number of all gray-scales in digital data by a ladder resistance and generating lacking gray-scale voltages by interpolating between the reference voltages by an operational amplifier (see for example Japanese Unexamined Patent Application Publication No. 2002-43944). A configuration example of such decoder circuit is shown in FIG. 10.

A decoder circuit 733 in FIG. 10 inputs 10 bits of image data $D_k$ and selects an output voltage corresponding to the input image data $D_k$ from 1024 ways of voltage levels. The decoder circuit 733 inputs $2^8+1$ of reference voltages $VR_0$ to $VR_{256}$, which is 257 gray-scales, that are generated by a reference voltage generation circuit not shown. The decoder circuit 733 can generate $2^{10}$ which is 1024 levels of output voltages by interpolating between the reference voltages by an operational amplifier 137. In the explanation below, the reference voltage $VR_0$ is assumed to be a reference voltage of a minimum voltage level, where the voltage level increases as the subscript increases, and the reference voltage $VR_{256}$ is assumed to be a reference voltage of a maximum voltage level.

In FIG. 10, a D/A converter (DAC) 134 inputs upper 8 bits (bit 9 to bit 2) of the image data $D_k$ and 257 levels of reference voltages and selects one voltage from the 257 levels of reference voltages according to the upper 8 bits of the image data $D_k$ to output. As with the DAC 134, a DAC 135 also selects one voltage from the 257 levels of reference voltages according to the upper 8 bits of the image data $D_k$ to output. Note that a decode logic for the DACs 134 and 135 is configured so that the DACs 134 and 135 select two adjacent reference voltages, for example $VR_0$ and $VR_1$.

Output voltages VD1 and VD2 of the DACs 134 and 135 are input to a selection circuit 136. The selection circuit 136 selects an input voltage from VD1 and VD2 to be supplied to four input terminals of the operational amplifier 137, which is described later. The selection circuit 136 includes six switches SW1 to SW6. Switching ON/OFF of the switches SW1 to SW6 is determined by lower 2 bits of the image data $D_k$. Note that the switches SW1 and SW4 operate complementally, meaning that when one of the switches is ON, another is OFF. By such operation, the input voltage to an input terminal VIN1 is determined to be VD1 or VD2. Likewise, by the complemented operation of the switches SW2 and SW5, the input voltage to an input terminal VIN2 is determined to be VD1 or VD2. Furthermore, by the complemented operation of the switches SW3 and SW6, the input voltage to an input terminal VIN3 is determined to be VD1 or VD2.

The operational amplifier 137 includes four input differential pairs. The operational amplifier 137 includes a negative feedback line for connecting an output terminal with an inverting input terminal and operates as a voltage follower. Note that among the four inverting input terminals of the operational amplifier 137, two terminals are short-circuited and a common signal is input to these two terminals. By such configuration, according to the combination of voltages input to the input terminals VIN1 to VIN3, the operational amplifier 137 outputs an output voltage $VS_k$, where the output voltage $VS_k$ is selected from two adjacent reference voltages $VR_i$ and $VR_{i+1}$ and three interpolated voltages obtained from a linear interpolation between $VR_i$ and $VR_{i+1}$. The output voltage $VS_k$ from the operational amplifier 137 can be represented by the following formula (1).

$$VS_k=(VIN1+VIN2+2\times VIN3)/4 \quad (1)$$

A relationship between the 257 levels of reference voltages $VR_0$ to $VR_{256}$ and the output voltage $VS_k$ generated from these reference voltages is shown in the table of FIG. 11. As an example, a case is considered in which a gray-scale level of the image data $D_k$ is 0, meaning that the image data $D_k$ is "0000000000". In this case, the DAC 134 selects $VR_0$ and the DAC 135 selects $VR_1$. Moreover, the selection circuit 136 selects VD1 to all of VIN1 to VIN3. Then the output voltage $VS_k$ from the operational amplifier 137 is $(VR_0+VR_0+2VR_0)/4=VR_0$.

Furthermore, if the gray-scale level of the image data $D_k$ is 1, meaning the image data $D_k$ is "0000000001", the DAC 134 selects $VR_0$ and the DAC 135 selects $VR_1$. Moreover, the selection circuit 136 selects VD1 for the VIN1 and VIN3 and selects VD2 for the VIN2. Then the output voltage $VS_k$ from the operational amplifier 137 is $(3VR_0+VR_1)/4$.

A decoder circuit as shown in FIG. 10 for generating an interpolated voltage using an operational amplifier has a characteristic that a voltage variation characteristic in a transition period until a gray-scale voltage output from the decoder circuit converges to a predetermined voltage level largely differs depending on a voltage level of the gray-scale voltage when a gray-scale level of the input image data $D_k$ changes exceeding a range generable from combinations of same reference voltages. For example, as for the decoder 733 of FIG. 10, a voltage variation characteristic fluctuates in a transition period until a gray-scale voltage output from the decoder circuit 733 converges to a predetermined voltage level, depending on the selection of the input differential pairs connected with outputs of the DACs 134 and 135.

Accordingly, the present inventor has recognized that in a transition period until a gray-scale voltage output from the decoder circuit converges to a predetermined voltage level, a deviation of a voltage difference between two adjacent gray-scale levels from the predetermined voltage difference is large. Furthermore, the present inventor has also discovered that due to this problem, the time taken for the gray-scale voltage output from the decoder circuit to converge to a predetermined level is long. The problems for the decoder circuit are described hereinafter in detail with reference to FIGS. 12 and 13.

In the decoder circuit 733 shown in FIG. 10, the number of input differential pairs connected with the output of the DACs 134 and 135 varies according to the voltage level of the output voltage $VS_k$. To be more specific, when image data has a gray-scale level k (for example gray-scale level 0), four input differential pairs included in the operational amplifier 137 are connected with the output of the DAC 134 while no input differential pair is connected with the output of the DAC 135. When the image data is gray-scale level k+1 (for example gray-scale level 1), three input differential pairs are connected with the output of the DAC 134 and one input differential pair is connected with the output of the DAC 135. When the image data is gray-scale level k+2 (for example gray-scale level 2), two input differential pairs are connected with the output of the DAC 134 and two input differential pairs are connected with the output of the DAC 135. When the image data is gray-scale level k+3 (for example gray-scale level 3), one input differential pair is connected with the output of the DAC 134 and three input differential pairs are connected with the output of the DAC 135. When the image data is gray-scale level k+4 (for example gray-scale level 4), no input differential pair is connected with the output of the DAC 134 four input differential pairs are connected with the and output of the DAC 135.

As described above, in the decoder circuit 733, the number of input differential pairs connected with the output of the DACs 134 and 135 fluctuates according to the voltage level of the output voltage $VS_k$. That is, by the voltage level (gray-scale level) selected by the decoder circuit 733, load capacitances for the DACs 134 and 135 change. Therefore, by a difference in combinations of the input differential pairs connected with the output of the DACs 134 and 135, voltage variation characteristics for VD1 and VD2 largely differ when the reference voltage selected by the DAC 134 or 135 changes. Therefore, a variation characteristic of the output voltage $VS_k$ from the operational amplifier 137 when the reference voltage selected by the DAC 134 or 135 changes depending on the combination of the input differential pairs connected with the output from the DACs 134 and 135.

FIG. 12 is a graph showing an example of voltage levels of the input signals VD1 and VD2 for the operational amplifier 137 and the output signal $VS_k$ from the operational amplifier 137. To be more specific, FIG. 12 shows voltage changes when VD1 and VD2 transit from near voltage level A to voltage level B by a change in the reference voltage selected by the DAC 134 or 135.

In FIG. 12, $VD1^{(n+1)}$ is an output voltage of the DAC 134 in case of gray-scale level n+1 and $VD2^{(n+1)}$ is an output voltage of the DAC 135 in case of gray-scale level n+1. The voltage level of the reference voltage selected by the DAC 135 is higher than the reference voltage selected by the DAC 134, and in a state where an output voltage converges, the relationship is represented as $VD1^{(n+1)} < VD2^{(n+1)}$. Furthermore, in case of gray-scale level n+1, suppose that three input differential pairs are connected with the output of the DAC 134 and one input differential pair is connected with the output of the DAC 135. In such case, the output $VD2^{(n+1)}$ from the DAC 135 having a small load capacitance converges to a predetermined voltage level (near voltage B) faster than the output $VD1^{(n+1)}$ of the DAC 134. Therefore, in the transition period until the voltage levels of $VD^{(n+1)}$ and $VD1^{(n+2)}$ converge, the voltage levels of $VD1^{(n+1)}$ and $VD2^{(n+1)}$ are reversed to be ($VD1^{(n+1)} > VD2^{(n+1)}$) and a voltage difference between them increases.

On the other hand, in FIG. 12, $VD1^{(n+2)}$ is an output voltage of the DAC 134 in case of gray-scale level n+2 and $VD2^{(n+2)}$ is an output voltage of the DAC 135 in case of gray-scale level n+2. In case of gray-scale level n+2, suppose that two input differential pairs are connected with the output of the DAC 134 and two input differential pairs are connected with the output of the DAC 135. In such case, the load capacitances connected with the outputs of the DACs 134 and 135 are equivalent. Therefore convergence speeds of $VD1^{(n+2)}$ and $VD2^{(n+2)}$ are almost equal and are almost middle between a convergence speed of $VD1^{(n+1)}$ and that of $VD2^{(n+1)}$.

As described above, due to the difference in the voltage variation characteristics of VD1 and VD2 which are input signals to the operational amplifier 137, as shown in FIG. 12, a variation characteristic of the output $VS_k^{(n+1)}$ in case of gray-scale level n+1 differs from a variation characteristic of the output $VS_k^{(n+2)}$ in case of gray-scale level n+2. FIG. 13 illustrates a voltage difference between two adjacent gray-scale levels when driving a liquid crystal display panel (panel load) by $VS_k^{(n+1)}$ and $VS_k^{(n+2)}$ shown in FIG. 12. In FIG. 13, the voltage difference between two adjacent gray-scale levels changes from voltage C to voltage D. However the time taken for the voltage difference converges to a predetermined voltage difference (voltage D) is long and a deviance of the voltage difference between two adjacent gray-scale levels from the predetermined voltage difference (voltage D) is large in a transition period. These phenomena are particularly apparent in a far end of a panel load.

SUMMARY

In one embodiment, a decoder circuit configured to output an analog voltage signal according to input digital data is provided. The decoder circuit includes an operational amplifier, first selection circuit and compensation unit. The operational amplifier includes a plurality of input differential pairs and generates an output voltage by interpolating input voltages applied to the plurality of input differential pairs. The first selection circuit selects the input voltages applied to the plurality of input differential pairs from reference voltages according to the digital data. The compensation unit suppresses a fluctuation in a transient variation characteristic of the input voltages applied to the plurality of input differential pairs depending on a selection of the input voltages by the first selection circuit in case at least one voltage level among the reference voltages is changed.

Note that in a first embodiment of the present invention described later, the operational amplifier included in the decoder circuit of the one embodiment corresponds to an operational amplifier 137, the first selection circuit corresponds to a selection circuit 136 and the compensation unit corresponds to a selection circuit 236 and dummy load 237.

As described above, the decoder circuit of the one embodiment is able to suppress a fluctuation in a transient voltage variation of the input voltage for the plurality of input differential pairs depending on the selection of the input voltage applied to the plurality of input differential pairs by the first selection circuit when at least one voltage level among the reference voltage is changed. Note that an output waveform of the operational amplifier is determined in response to an input voltage waveform of the operational amplifier. Therefore, by the abovementioned configuration, when at least one voltage level among the plurality of reference voltages is changed, it is possible to suppress a fluctuation in a transient variation characteristic of a output voltage from the operational amplifier until the output voltage from the operational amplifier converges to a predetermined voltage level depending on a selection of the input voltages applied to the plurality of input differential pairs.

In another embodiment, a decoder circuit outputs an interpolated voltage signal by selectively connecting one of a plurality of analog power supply outputs with each of input terminals included in an operational amplifier. The decoder circuit of the another embodiment includes an impedance device group and compensation unit. Each impedance value of the plurality of impedance devices is almost equal to an impedance between each of the plurality of analog power supply outputs and the plurality of input terminals or a total impedance value of any combination thereof. Furthermore, the compensation unit maintains each load impedance of the plurality of analog power supply outputs to be within a predetermined range by selectively connecting the plurality of impedance devices with the analog power supply outputs according to a selection of the analog power supply outputs connected to the plurality of input terminals.

Note that in the first embodiment of the present invention described later, the plurality of analog power supply outputs included in the decoder circuit of the another embodiment correspond to D/A converters 134 and 135. Furthermore, the operational amplifier corresponds to an operational amplifier 137, impedance device group corresponds to a dummy load 237 and the compensation unit corresponds to a selection circuit 236.

As described above, the decoder circuit according to the another embodiment of the present invention operates so that each load impedance of the plurality of analog power supply outputs to be constant by including the impedance device group and compensation unit. Therefore, it is possible to suppress a fluctuation in a transient variation characteristic of the input voltage for the plurality of input differential pairs depending on the selection of the input voltages for the plurality of input differential pairs in case at least one voltage level among the plurality of analog power supply outputs is changed. Note that an output waveform of the operational amplifier is determined in response to an input voltage waveform of the operational amplifier. Therefore, by the above-mentioned configuration, when at least one voltage level among the plurality of analog power supply output is changed, it is possible to suppress a fluctuation in a transient variation characteristic of a output voltage from the operational amplifier until the output voltage of the operational amplifier converges to a predetermined voltage level depending on the selection of the input voltages applied to the operational amplifier.

By using the decoder circuit according to the one or the another embodiment of the present invention as a driving circuit for display device, a deviation of a voltage difference between adjacent gray-scale levels in a transition period until a gray-scale voltage output from the decoder circuit converges to a predetermined voltage level can be reduced. Moreover, the time taken for the voltage difference between adjacent gray-scale levels to converge to the predetermined voltage difference can also be reduced.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 5 shows a decode logic of the decoder circuit according to an embodiment of the present invention;

FIG. 11 shows a decode logic of the decoder circuit according to the related art;

DETAILED DESCRIPTION OF THE PREFERRED EMBODIMENTS

Figure 1:
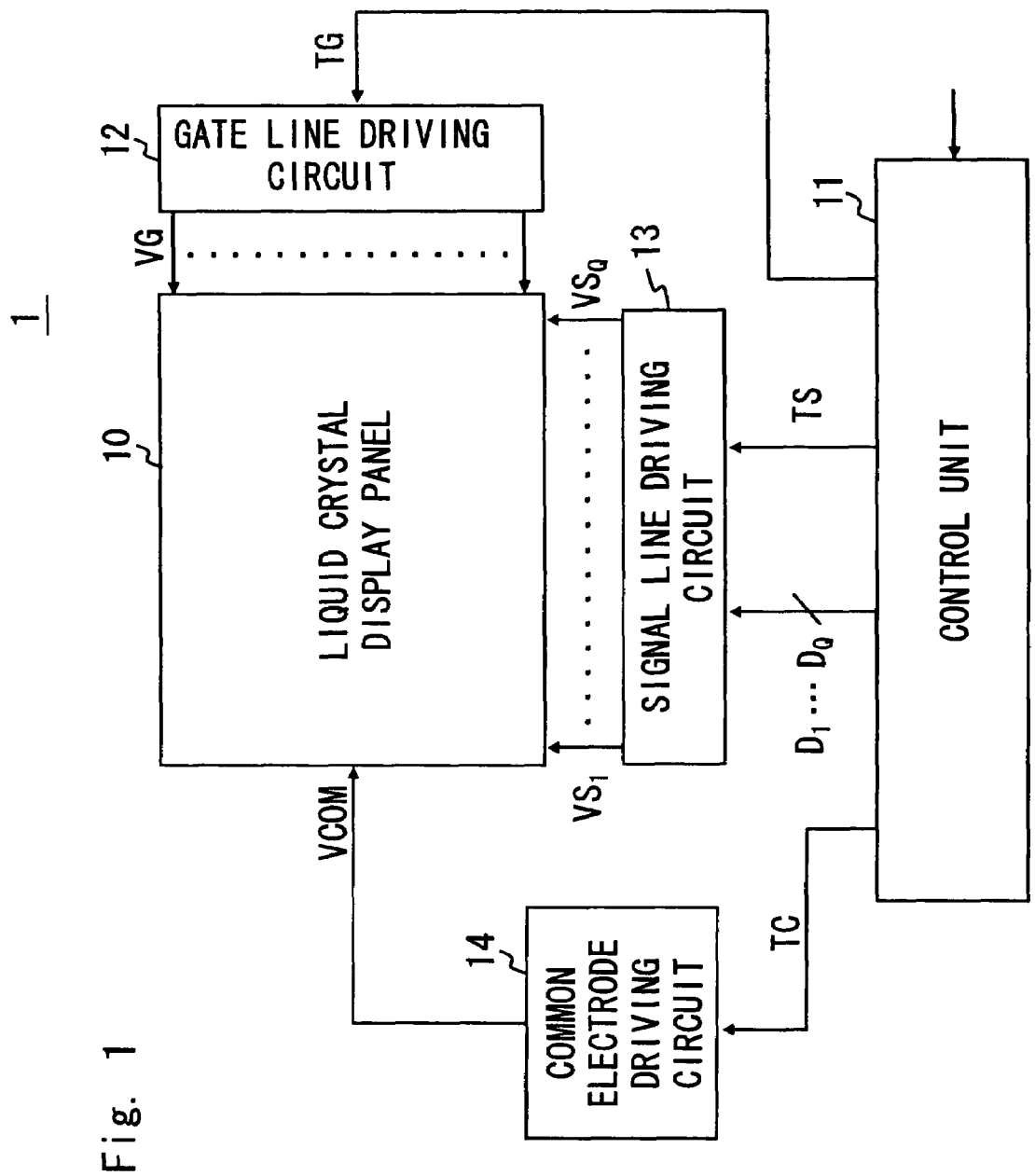
FIG. 1 is a block diagram of a liquid crystal display apparatus according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the drawings, components identical are denoted by reference numerals identical to those therein with detailed description omitted as necessary for clarity of explanation.

First Embodiment

Figure 2:
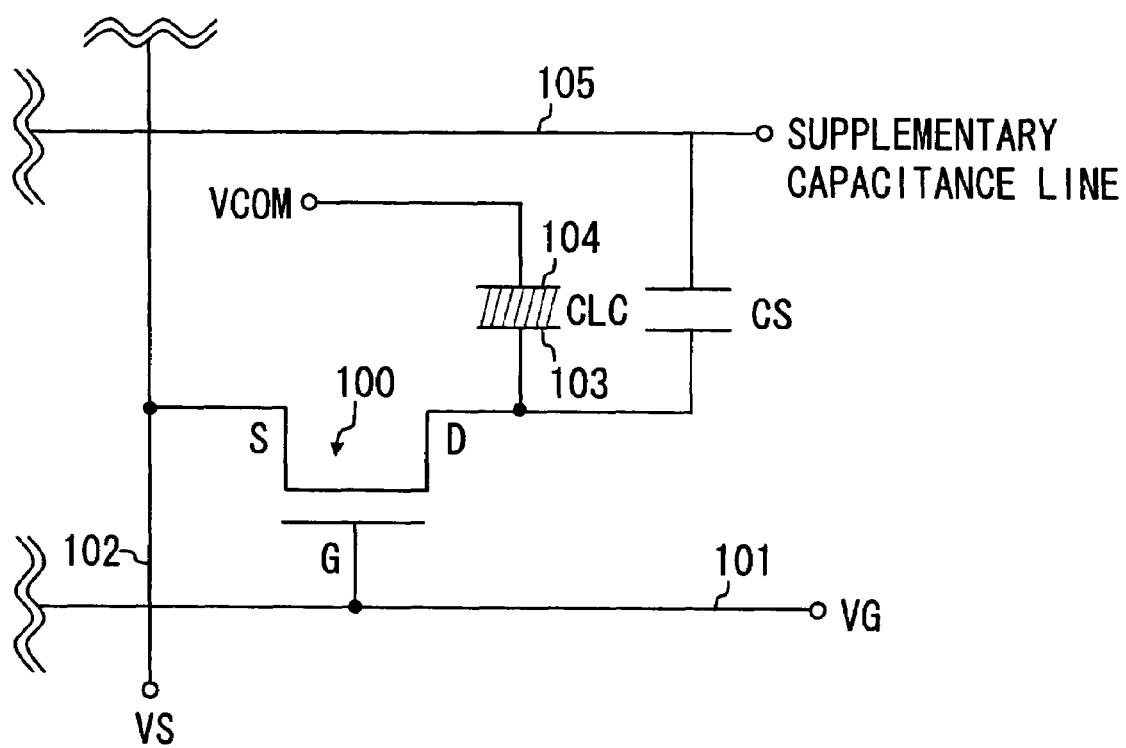
FIG. 2 shows an equivalent circuit of a liquid crystal display panel.

A schematic configuration of a liquid crystal display apparatus 1 according to this embodiment is shown in FIG. 1. In FIG. 1, a liquid crystal display panel 10 is an active matrix type liquid crystal display panel using TFTs (Thin Film Transistor) for switching devices. The liquid crystal display panel 10 includes TFTs, liquid crystal capacitance $C_{LC}$ and supplementary capacitance $C_S$ in intersections of a plurality of gate lines (scanning lines) and source lines (signal lines) arranged in a lattice. FIG. 2 shows an equivalent circuit of the liquid crystal display panel 10.

As shown in FIG. 2, a gate electrode G of a TFT 100 is connected with a gate line 101, a source electrode S is connected with a source line 102 and a drain electrode D is connected with a pixel electrode 103 of the liquid crystal capacitance $C_{LC}$ and supplementary capacitance $C_S$. The liquid crystal capacitance $C_{LC}$ is a capacitance included in a liquid crystal held between the pixel electrode 103 and a common electrode 104. The supplementary capacitance $C_S$ is a capacitance for retaining a voltage applied to the liquid crystal even after gate off. FIG. 2 illustrates a case when providing the supplementary capacitance $C_S$ between the pixel electrode 103 and a supplementary capacitance line 105, however one end of $C_S$ may be connected with an adjacent gate line instead of the supplementary capacitance line 105. The liquid crystal display panel 10 is driven by a gate voltage VG, source voltage VS and common voltage VCOM that are supplied from a gate line driving circuit 12, a signal line driving circuit 13 and a common electrode driving circuit 14.

A control unit 11 outputs a gate line drive timing signal TG to the gate line driving circuit 12 for indicating a timing to drive the gate line 101. On the other hand, for the signal line driving circuit 13, the control unit 11 outputs 1 line of image data $D_1$ to $D_Q$ and a source line drive timing signal TS. The source line drive timing signal TS is a signal to indicate a timing to drive the plurality of source lines 102 by a gray-scale voltage according to the image data $D_1$ to $D_Q$. Furthermore, for the common electrode drive circuit 14, the control unit 11 outputs a VCOM inversion timing signal TC for notifying a polarity invert cycle of VCOM. The VCOM inversion timing signal TC is a signal to notify a polarity invert cycle corresponding to a polarity invert driving method of liquid crystal applied voltage $V_{LC}$ such as a frame inversion drive, line inversion drive and dot inversion drive.

The gate line driving circuit 12 sequentially supplies the gate voltage VG to the plurality of gate lines 101 included in the liquid crystal display panel 10 according to the gate line drive timing signal TG indicated by the control unit 11.

The signal line driving circuit 13 receives the image data $D_1$ to $D_Q$ from the control unit 11 and supplies source voltages $VS_1$ to $VS_Q$ corresponding to the image data $D_1$ to $D_Q$ to the plurality of source lines 102 included in the liquid crystal display panel 10 according to the source line drive timing signal TS indicated by the control unit 11. Note that in this embodiment, one pixel of the image data $D_k$(k=1 to Q) is 10 bits and the source voltage $VS_k$ is selected correspondingly to the image data $D_k$ from 1024 levels of gray-scale voltages.

The common electrode driving circuit 14 supplies the common voltage VCOM to the common electrode 104 of the liquid crystal display panel 10. An inversion timing of VCOM in case of a common inversion drive is indicated by the VCOM inversion timing signal TC from the control unit 11.

Figure 3:
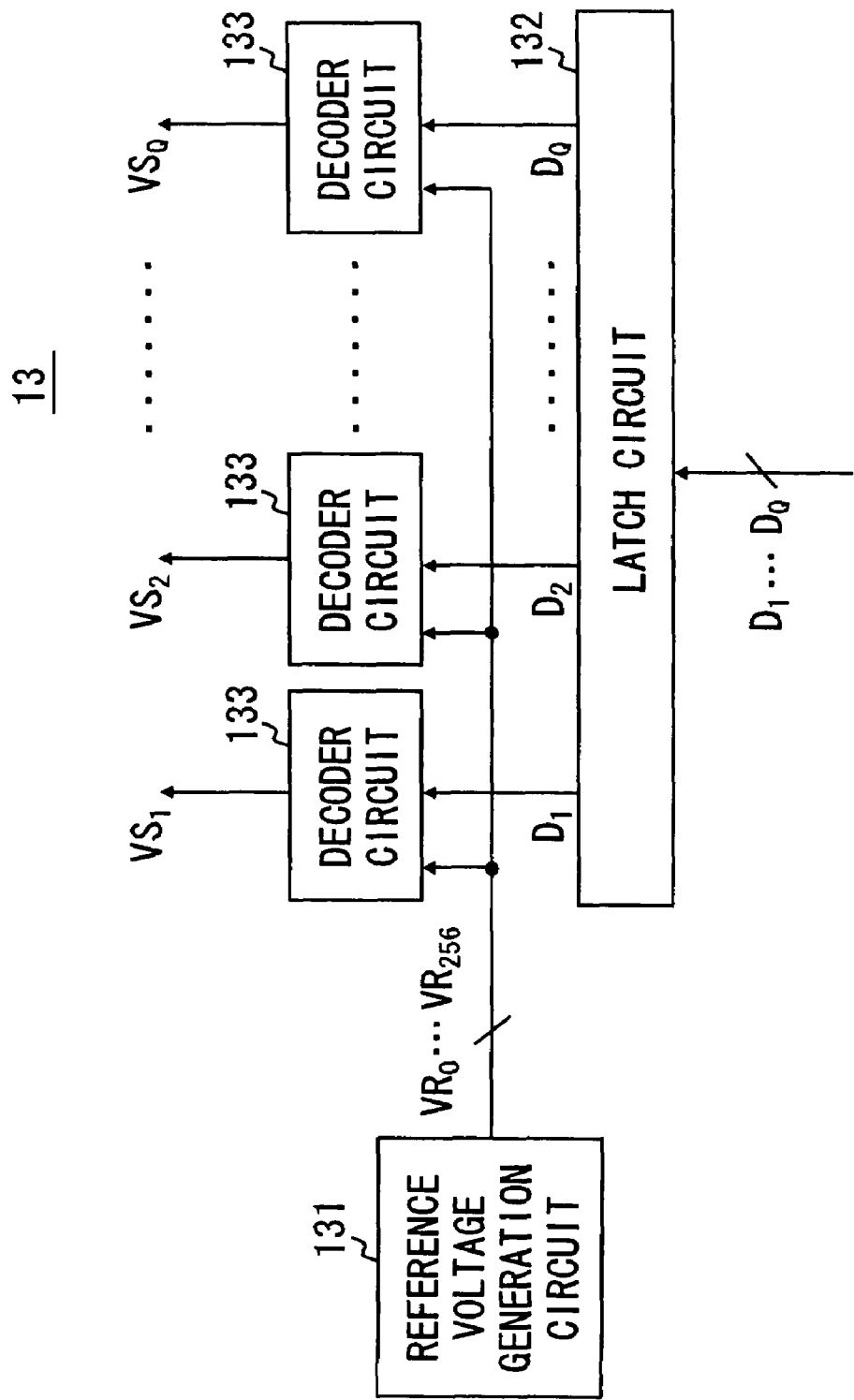
FIG. 3 is a block diagram of a signal line driving circuit according to an embodiment of the present invention.

Next, the configuration of the signal line driving circuit 13 is described. The principle part of the signal line driving circuit 13 is shown in FIG. 3. In FIG. 3, a reference voltage generation circuit 131 generates 257 gray-scale levels of reference voltages $VR_0$ to $VR_{256}$. A latch circuit 132 latches one line of the image data $D_1$ to $D_Q$ input from the control unit 11.

Figure 10:
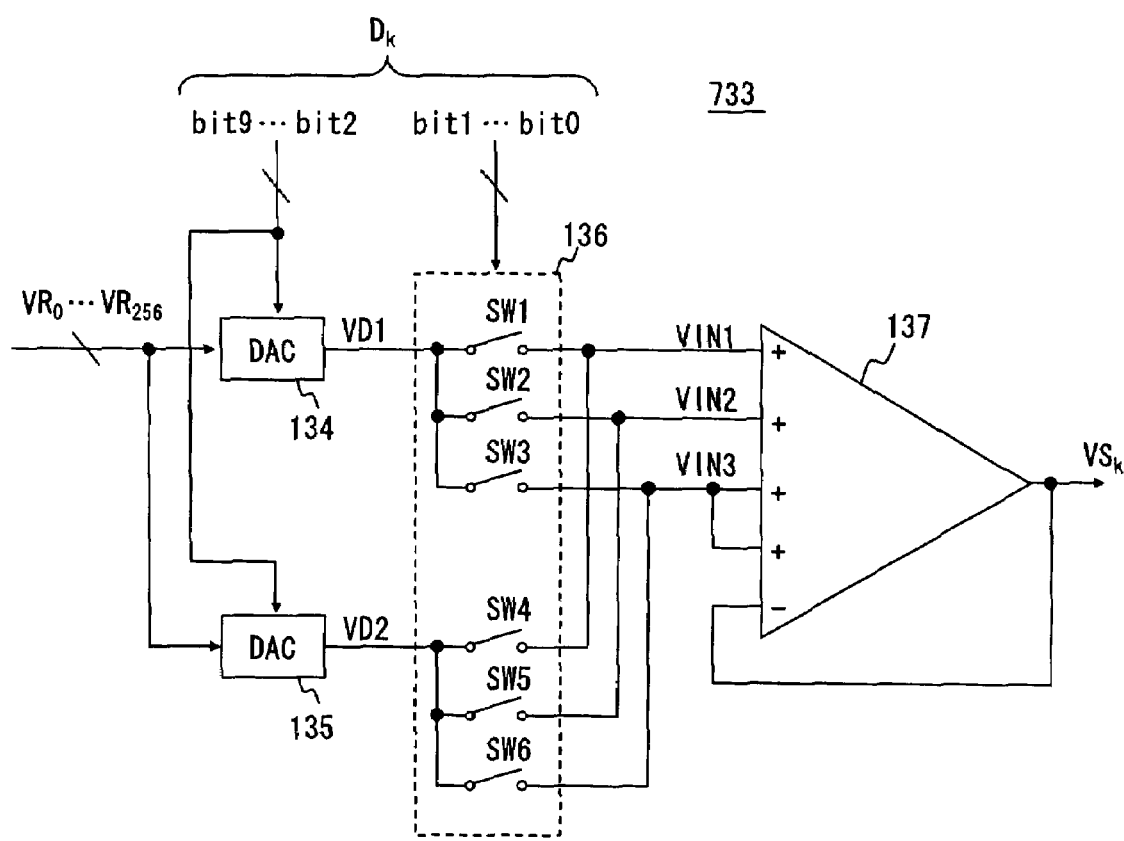
FIG. 10 is a block diagram of a decoder circuit according to the related art.

Furthermore, the signal line driving circuit 13 includes a plurality of decoder circuits 133. In this embodiment, one decoder circuit 133 is disposed for each of the source lines 102 in the liquid crystal display panel 10. Each decoder circuit 133 inputs the reference voltages $VR_0$ to $VR_{256}$ generated by the reference voltage generation circuit 131 and one pixel of the image data $D_k$(k=1 to Q), which is 10 bits, and outputs a gray-scale voltage selected according to the image data $D_k$ from 1024 gray-scale voltage levels. That is, the decoder circuit 133 must be able to generate output signals of $2^{10}$ (1024) ways of voltage levels. Therefore, as with the decoder circuit 733 shown in FIG. 10, the decoder circuit 133 of this embodiment is able to generate lacking voltage levels by interpolating the reference voltages $VR_0$ to $VR_{256}$ smaller in the number of gray-scale levels in the image data $D_k$.

Figure 4:
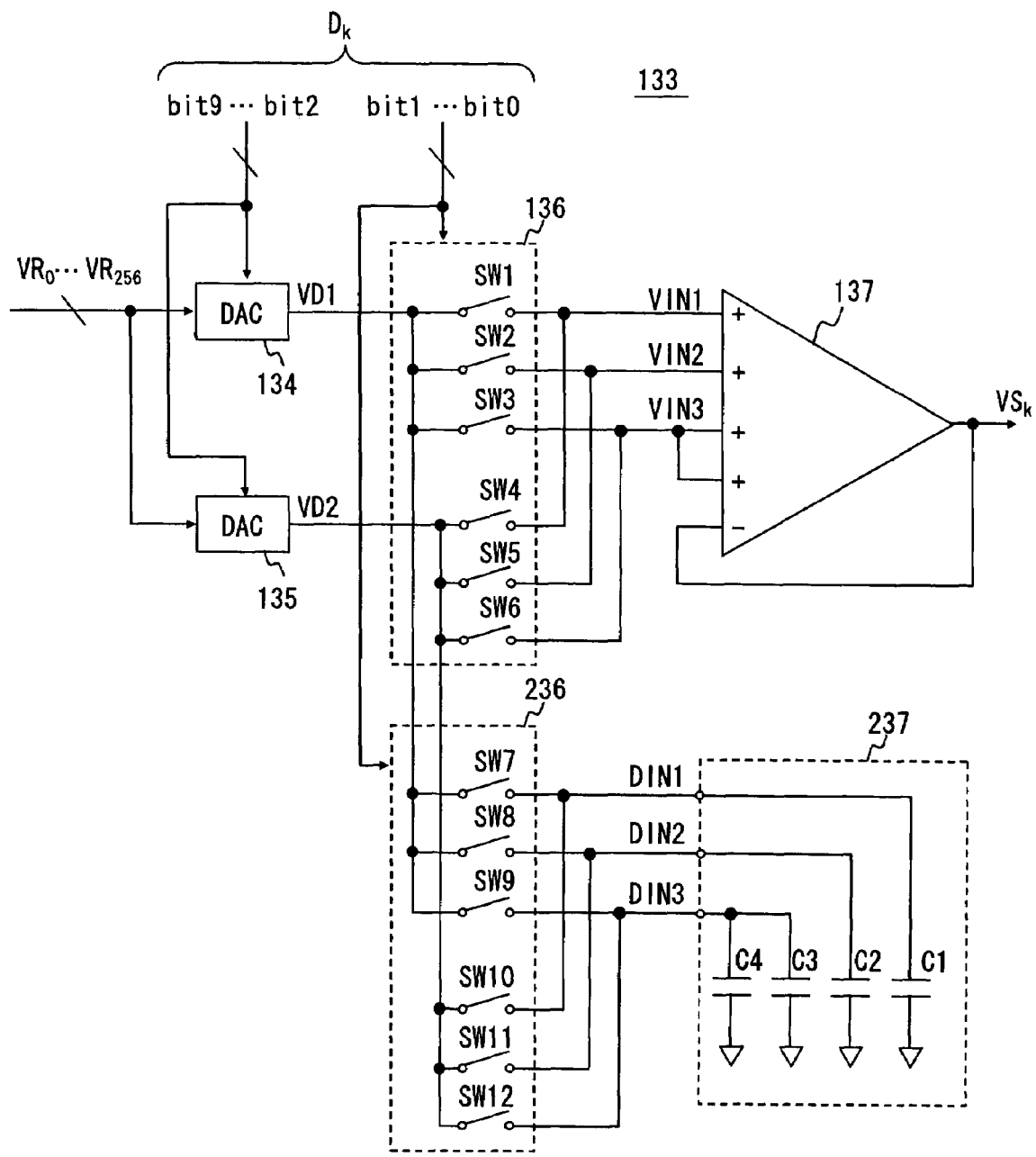
FIG. 4 is a block diagram of a decoder circuit according to an embodiment of the present invention.

The configuration of the decoder circuit 133 is shown in FIG. 4. Note that for the components shown in FIG. 4, DACs 134 and 135, selection circuit 136 and operational amplifier 137 are identical to those included in the decoder circuit 733 which is explained with reference to FIG. 10, thus the detailed explanation is omitted here.

A selection circuit 236 determines a connection relationship between three input terminals DIN1 to DIN3 for a dummy load 237 and DACs 134 and 135. The selection circuit 236 includes six switches SW7 to SW12. Switching ON/OFF of these switches SW7 to SW12 is determined by lower two bits of the image data $D_k$. Note that the switches SW7 and SW10 operate complementally, meaning that when one of the switches is ON, another is OFF. By such operation, a connection of the input terminal DIN1 for the dummy load 237 is determined to be either with the DAC 134 or 135. Likewise, by the complemented operation of the switches SW8 and SW11, a connection of the input terminal DIN2 is determined to be either with the DAC 134 or 135. Moreover, by the complemented operation of the switches SW9 and SW12, a connection of the input terminal DIN3 is determined to be either with the DAC 134 or 135.

The dummy load 237 includes four capacitors C1 to C4. In this embodiment, electrostatic capacitances for each of the capacitors C1 to C4 are determined to be the same as the load capacitance of the operational amplifier 137 viewed from the DACs 134 and 135. To be more specific, the electrostatic capacitances for each of the capacitors C1 to C4 form four input differential pairs of the operational amplifier 137 and the electrostatic capacitances may be determined to be the same as the load capacitances of each input transistor connected with the input terminals VIN1 to VIN3.

As described above, in the decoder circuit 733 of the related art, when the gray-scale levels of the image data $D_k$ changes exceeding a range generable from combinations of same two adjacent reference voltages, a transient voltage variation characteristic of the output voltage $VS_k$ of the operational amplifier 137 changes depending on the combination of input differential pairs connected with the outputs of DACs 134 and 135. The selection circuit 236 and dummy load 237 included in the decoder circuit 133 of this embodiment operates as a compensation unit for suppressing a difference generated in the voltage variation characteristic of the output from the operational amplifier 137. Hereinafter, it is described that operations of the switches SW7 to SW12 included the selection circuit 236 for suppressing the difference in the voltage variation characteristic of the output voltage $VS_k$ from the operational amplifier 137.

The switches SW7 to SW12 included in the selection circuit 236 determine the connection relationship between DACs 134 and 135 with capacitors C1 to C4 included in the dummy load 237 so that the load capacitance connected with each output of the DACs 134 and 135 to be constant or within a certain range, regardless of the selection for the combination of input voltages applied to the operational amplifier 137 by the selection circuit 136. In this embodiment, the maximum number of input differential pairs of the operational amplifier 137 connected with each of the DACs 134 and 135 is four, and four input transistors including in the input differential pairs of the operational amplifier 137 are connected respectively to the input terminals VIN1 to VIN3. Therefore, irrespective of how the combination of the input voltages applied to the operational amplifier 137 is selected by the selection circuit 136, the switches SW7 to SW12 operate to keep the condition in which each outputs of the DACs 134 and 135 is connected with an electrostatic capacitance equivalent to the sum of load capacitances of the four input transistors.

To be more specific, the switches may be controlled so that each of SW1 to SW3 and each of corresponding SW7 to SW9 operate complementary, meaning that when one of the switches is ON, another is OFF. Likewise, the switches may be controlled so that each of SW4 to SW6 and each of corresponding SW10 to SW12 operate complementary. The relationship of ON/OFF state for the switches SW1 to SW12 is shown in FIG. 5. For example, if the gray-scale level of the image data $D_k$ is n and the output voltage VD1 from the DAC 134 is supplied to all the input terminals VIN1 to VIN3 of the operational amplifier 137, the switches SW1 to SW3 are ON, SW4 to SW6 are OFF, SW7 to SW9 are OFF and SW10 to SW12 are ON. Moreover, when the gray-scale level of the image data $D_k$ is n+1, the output voltage VD1 from the DAC 134 is supplied to the input terminals VIN1 and VIN3 and the output voltage VD2 from the DAC 135 is supplied to the input terminal VIN2, the switches SW1 and SW3 are ON, SW2 is OFF, SW4 and SW6 are OFF, SW5 is ON, SW7 and SW9 are OFF, SW8 is ON, SW10 and SW12 are ON and SW11 is OFF.

When SW1 to SW3 are ON and SW4 to SW6 are OFF, SW7 to SW12 may be OFF and the dummy load may not be connected with the output of the DAC 135. Moreover, when SW1 to SW3 are OFF and SW4 to SW6 are ON, SW7 to SW12 may be ON and the dummy load may not be connected with the output of the DAC 134. To be more specific, they are the cases of gray-scale levels n, n+4 and n+8. This is because that the DAC not connected with the input terminals of the operational amplifier 137 does not influence the output waveform of the operational amplifier 137.

Figure 6:
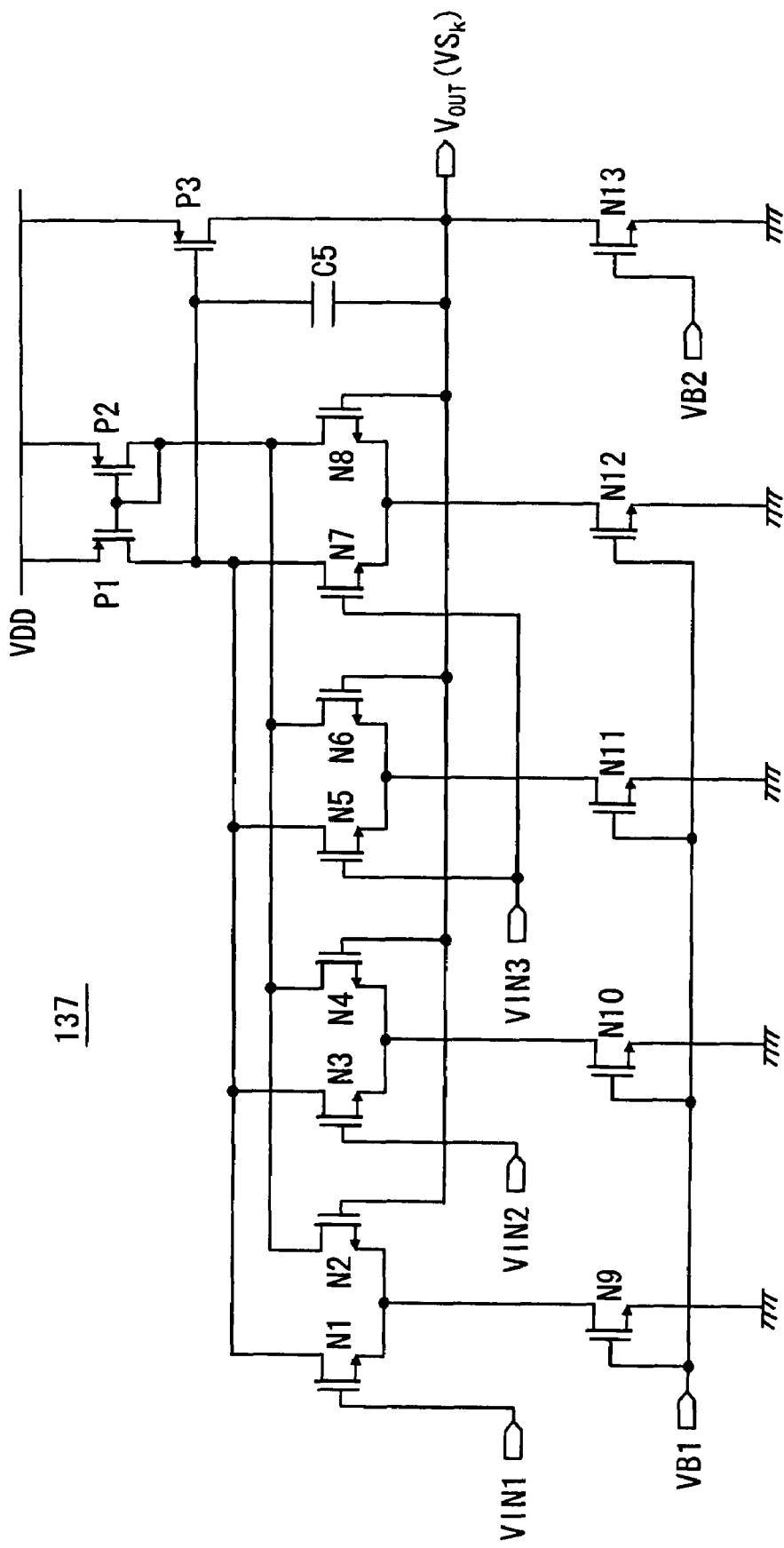
FIG. 6 shows a configuration example of an operational amplifier included in the decoder circuit according to an embodiment of the present invention.
Figure 7:
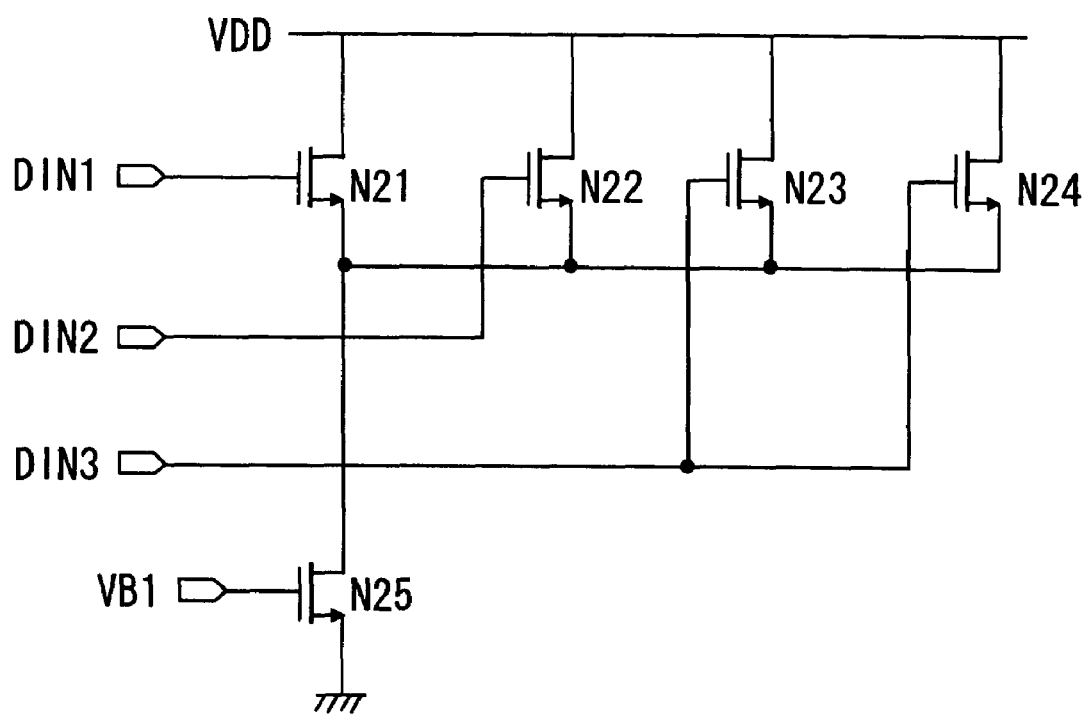
FIG. 7 shows a configuration example of a dummy load included in the decoder circuit according to an embodiment of the present invention.

Hereinafter, a configuration example of the operational amplifier 137 and dummy load 237 is described. A configuration example of the operational amplifier 137 is shown in FIG. 6 and a configuration example of the dummy load 237 is shown in FIG. 7. The example of FIG. 6 is the operational amplifier 137 made up of a simple two-stage operational amplifier. In FIG. 6, N channel MOS transistors N1 and N2 form an input differential pair and sources of the transistors N1 and N2 connected in common are connected to ground via an N channel MOS transistor N9 operating as a constant current source. Likewise, each pair of N channel MOS transistors N3 and N4, N5 and N6 and N7 and N8 forms an input differential pair. Sources of the transistors N3 to N8 are connected to ground via N channel MOS transistors N10 to N12 operating as constant current sources. A bias voltage VB1 is applied to gates of the transistors N9 to N12.

P channel MOS transistors P1 and P2 form a current mirror load for the four input differential pairs. To be more specific, sources of the transistors P1 and P2 are connected with a power supply VDD. Drains of the transistors N1, N3, N5 and N7 are connected with a drain of the transistor P1. Drains of the transistors N2, N4, N6 and N8 are connected with a drain of the transistor P2. Moreover, the transistor P2 is diode-connected, in which the gate and drain of the transistor P2 are short-circuited.

A P channel MOS transistor P3 forms an output stage of the two-stage operational amplifier. The P channel MOS transistor has a gate connected with the drain of the transistor P1 and a drain connected with ground via an N channel MOS transistor N13 operating as a constant current source. A bias voltage VB2 is applied to a gate of the transistor N13 operating as a constant current source. A capacitor C5 provided to a line for connecting between an output terminal $V_{OUT}$ and the transistor P3 is a compensation capacitor for frequency compensation of the two-stage operational amplifier 137. The output terminal $V_{OUT}$ is connected with gates of the transistors N2, N4, N6 and N8.

Next, a configuration example of the dummy load 237 shown in FIG. 7 is described. FIG. 7 shows the configuration in which the capacitors C1 to C4 are formed by N channel MOS transistors N21 to N24 and an N channel MOS transistor N25 operating as a constant current source is connected with sources of the transistors N21 to N24.

In FIG. 7, the transistors N21 to N24 preferably have the same characteristics as the transistors N1, N3, N5 and N7 forming input differential pairs of the operational amplifier 137 except for characteristic variations in the manufacturing process of the transistors N21 to N24. By such configuration, the same capacitance as the load capacitances of the transistors N1, N3, N5 and N7 can be easily provided to the dummy load 237. Furthermore, there is a bias dependency in gate capacitance of a usual MOS transistor. Therefore it is preferable to use a transistor having the same characteristics as the current source transistors N9 to N12 in FIG. 6 for a transistor N25 operating as a constant current source and the bias voltage VB1 is applied to a gate of the transistor N25 as with the transistors N9 to N12. By such configuration, the transistors N1, N3, N5 and N7 in FIG. 6 and transistors N21 to 24 in FIG. 7 are biased in the same way and thus it is possible to suppress variations in gate capacitances of these transistors due to a difference in bias current. Therefore, a capacitance of the dummy load 237 can be adjusted in more detail in order to be close to the load capacitance of the input transistor for the operational amplifier 137.

Figure 8:
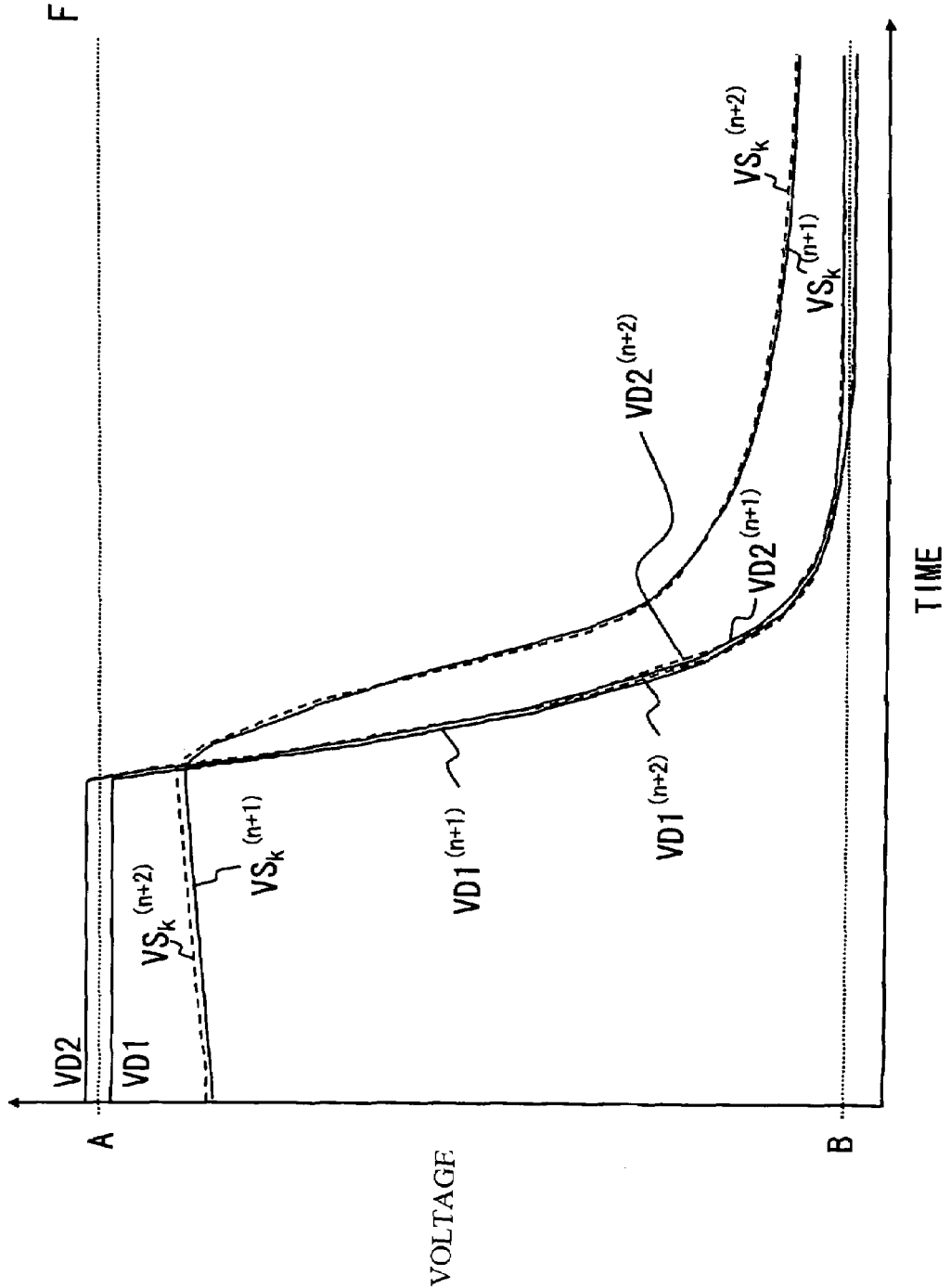
FIG. 8 is a graph showing an input and output voltage levels of an operational amplifier included in the decoder circuit according to an embodiment of the present invention.

Hereinafter, a voltage variation characteristic of an output voltage from the decoder circuit 133 of this embodiment is described in detail with reference to FIGS. 8 and 9. FIG. 8 is a graph showing voltage levels of input signals VD1 and VD2 and output signal from the operational amplifier 137. To be more specific, FIG. 8 shows a voltage change when VD1 and VD2 transit from near voltage A to voltage B by a change in the reference voltage selected by the DAC 134 or 135.

Figure 12:
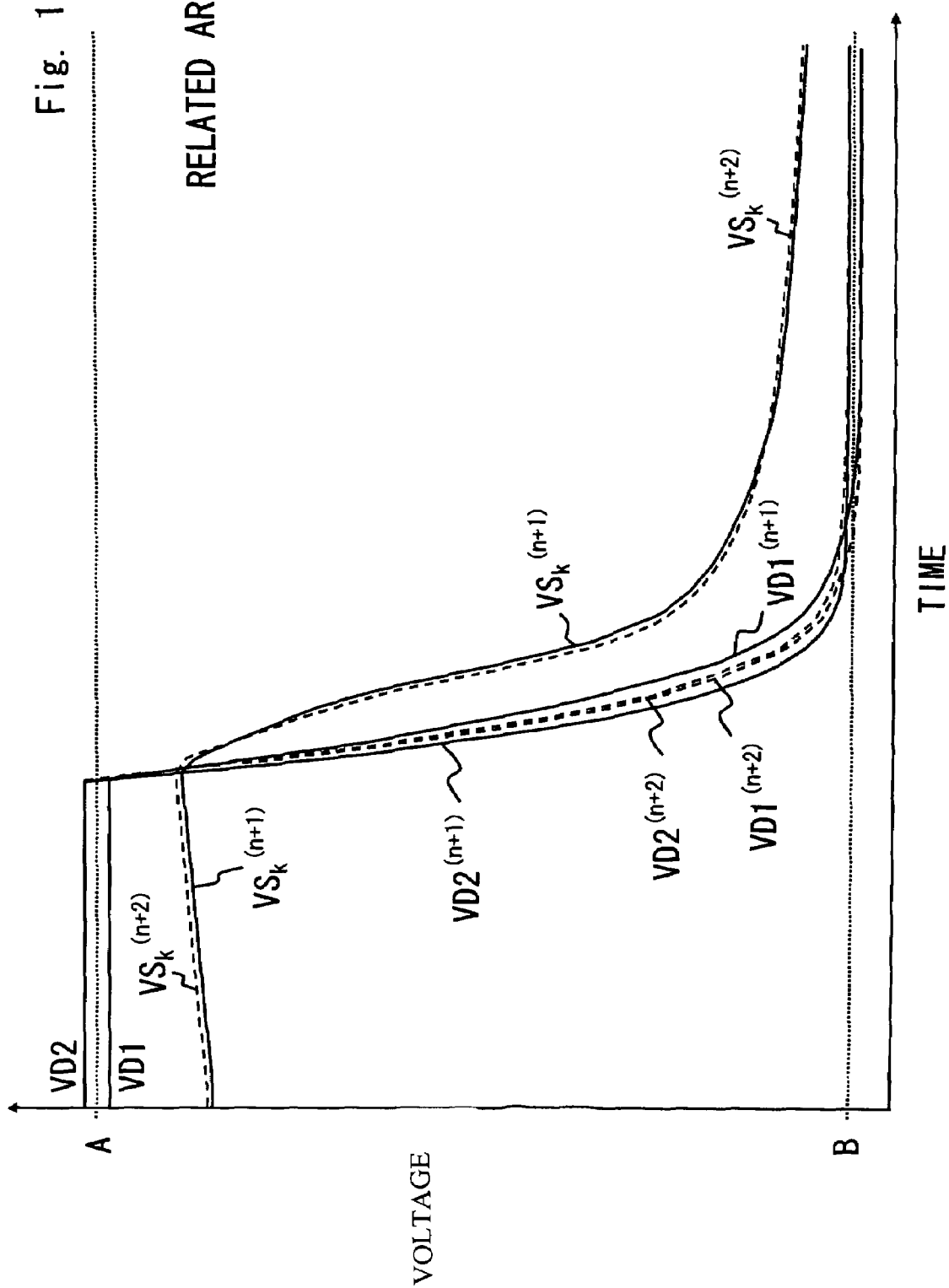
FIG. 12 is a graph showing an input and output voltage levels of an operational amplifier included in the decoder circuit according to the related art.

By comparing FIG. 8 and FIG. 12 that illustrate changes of voltage levels of the decoder circuit 733 according to a related art, advantageous effects of providing the dummy load 237 to the decoder circuit 133 become apparent. More specifically, in FIG. 12, due to a difference between the load capacitances connected with the DACs 134 and 135, there is a large difference in voltage variation characteristics of $VD1^{(n+1)}$, $VD2^{(n+1)}$, $VD1^{(n+2)}$ and $VD2^{(n+2)}$. Furthermore, in FIG. 12, also for a voltage variation characteristic of the output voltage $VS_k$ of the operational amplifier 137, there is a difference between the output $VS_k^{(n+1)}$ in case of gray-scale level n+1 and output $VS_k^{(n+2)}$ in case of gray-scale level n+2. On the other hand, in this embodiment, the dummy load 237 is connected with the DACs 134 and 135 so that the size of the load capacitances connected with the outputs of the DACs 134 and 135 is close to constant regardless of the output voltage level (output gray-scale voltage level) of the decoder circuit 133. With such configuration, as shown in FIG. 8, a difference in voltage variation characteristics between $VD1^{(n+1)}$, $VD2^{(n+1)}$, $VD1^{(n+2)}$ and $VD2^{(n+2)}$ is suppressed better than the related art. Consequently, a difference in the voltage variation characteristics between the outputs voltages $VS_k^{(n+1)}$ and $VS_k^{(n+2)}$ is also suppressed better than the related art.

Figure 9:
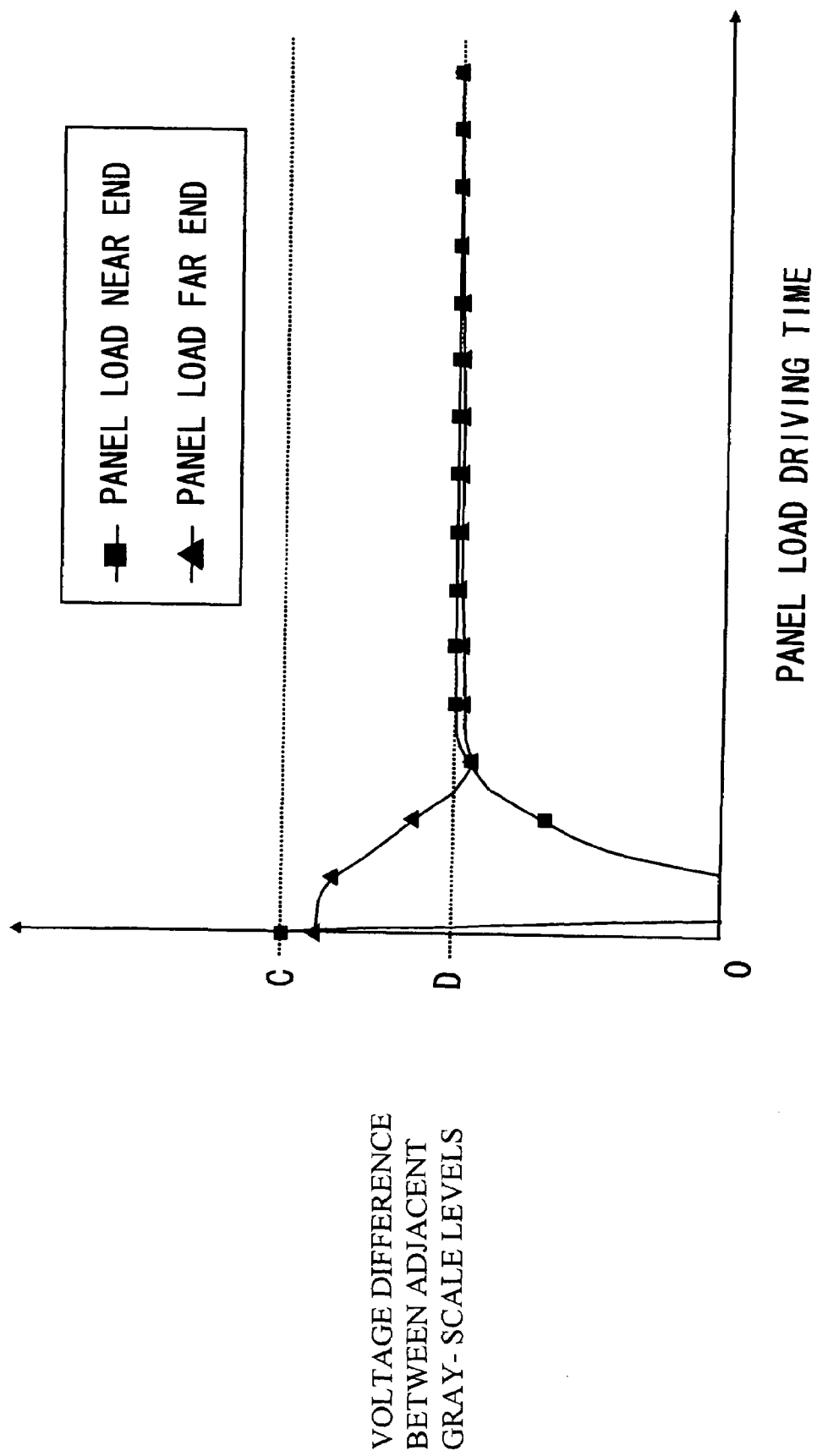
FIG. 9 is a graph showing a voltage difference between adjacent gray-scale voltages output from the operational amplifier included in the decoder circuit according to an embodiment of the present invention.
Figure 13:
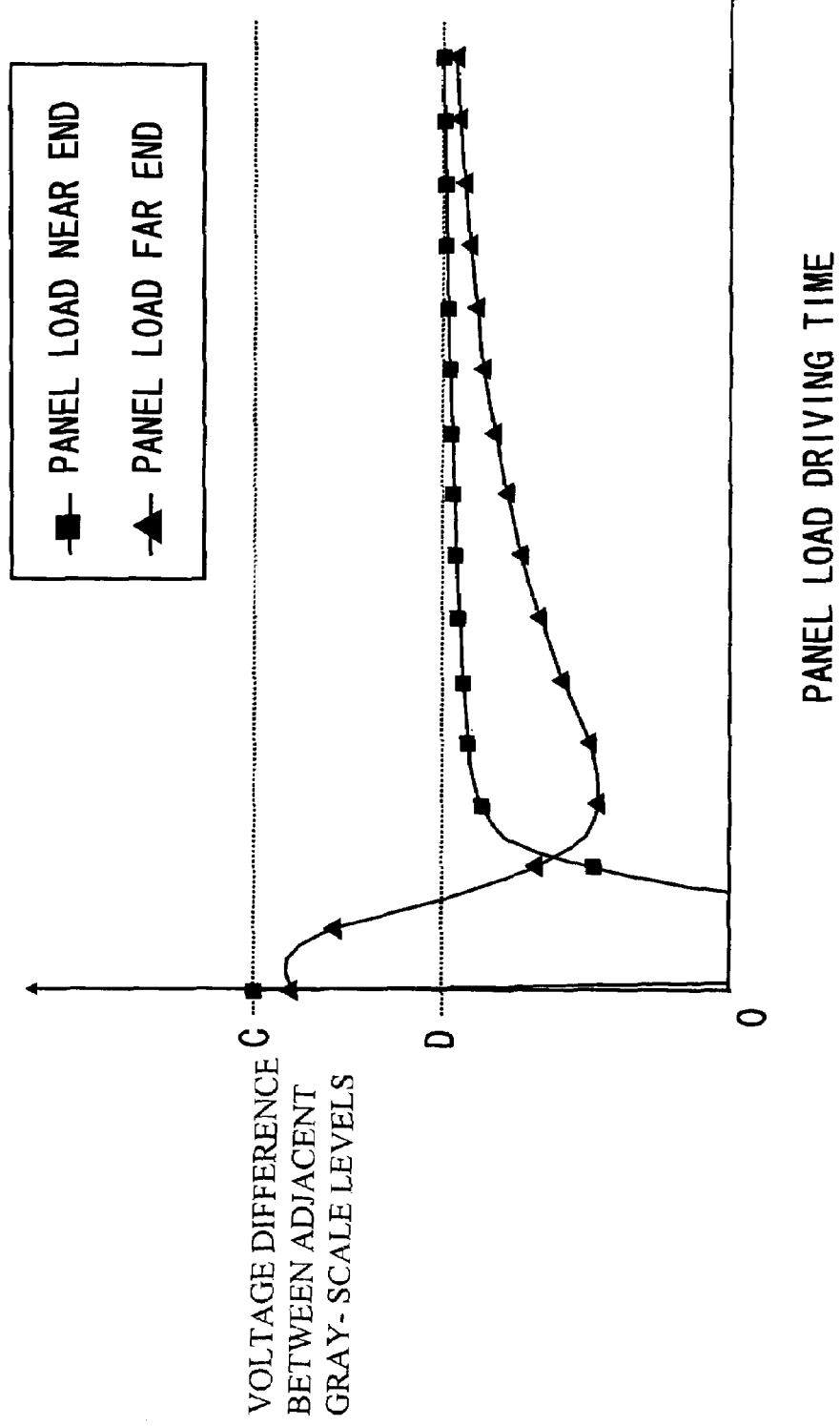
FIG. 13 is a graph showing a voltage difference between adjacent gray-scale voltages output from the operational amplifier included in the decoder circuit according to the related art.

FIG. 9 shows a voltage difference between two adjacent gray-scale levels when driving the liquid crystal display panel 10 (panel load) by $VS_k^{(n+1)}$ and $VS_k^{(n+2)}$ shown in FIG. 8. In FIG. 9, as with FIG. 13, the voltage difference between two adjacent gray-scale levels changes from voltage C to voltage D. As can be seen from a comparison between FIGS. 9 and 13, by the decoder circuit 133 of this embodiment, the time taken for the voltage difference between two adjacent gray-scale levels converges to a predetermined voltage difference (voltage D) can be shortened and a deviance of the voltage difference between two adjacent gray-scale levels from the predetermined voltage difference (voltage D) in a transition period can also be reduced.

Note that in the abovementioned decoder circuit 133, an internal resistance of the selection circuit 236 is preferably the same as an internal resistance of the selection circuit 136. More specifically, as described with reference to FIGS. 6 and 7, the capacitances of the capacitors C1 to C4 included in the dummy load 237 may be made the same as the load capacitance of the input transistor for the operational amplifier 137. Furthermore, the switches SW7 to SW12 included in the selection circuit 236 may have the same characteristics, more specifically the same internal resistance value, as the switches SW1 to SW6 included in the selection circuit 136 and the number of switches in the selection circuit 236 may be made the same as the number of switches in the selection circuit 136. For example, when using analog switches (transmission gates) to the switches SW1 to SW12, parameters such as a gate width and channel length of the transistors may be uniformed among SW1 to SW6 and SW7 to SW12. By such configuration, regardless of the selection of the combination of input voltage to the operational amplifier 137 by the selection circuit 136, a load with constant impedance or within predetermined range is connected with each of the DACs 134 and 135. Therefore, the difference in the voltage variation characteristics of VD1 and VD2 that are input to the operational amplifier 137 can further be suppressed.

Moreover, the configuration of the abovementioned decoder circuit 133 is an example. That is, a number of bits of the image data $D_k$, the number of reference voltages generated by the reference voltage generation circuit 131 and the number of interpolated voltages generated by the operational amplifier 137 from the reference voltages are merely an example. For example, the operational amplifier 137 is described to have a configuration that generates three interpolated voltages by dividing between the two reference voltages by four. However various variations can be made, for example a configuration that divides between two reference voltages by 8 and a configuration that inputs three or more reference voltages to perform an operation.

Furthermore, the configuration of the decoder circuit 133 using two DACs 134 and 135 and selection circuits 136 and 236 is an example. That is, the present invention can be widely incorporated to a decoder circuit having an operational amplifier that is able to generate a voltage for interpolating two or more reference voltages by inputting the reference voltages and performing an operation, and the present invention is not limited to the abovementioned specific configurations.

Other Embodiment

In order to cancel an output offset caused by characteristic variations for the two transistors forming the differential pair of the operational amplifier 137, a technique is known which periodically switches signal supply sources for the two transistors forming the differential pair. In the first embodiment, the switches SW7 to SW12 included in the selection circuit 236, capacitors C1 to C4 and transistors N21 to N24 included in the dummy load 237 possibly have characteristic variations generated in the manufacturing process. Accordingly, with the abovementioned technique for offset cancel of a differential pair incorporated, a configuration may be employed in which combinations of the switches SW7 to SW12 forming the selection circuit 236 and capacitors C1 to C4 and transistors N21 to N24 forming the dummy load 237 are periodically switched. Specifically, a switch and redundant line for periodically changing these combinations may be provided. By such configuration, characteristic variations of devices forming the selection circuit 236 and dummy load 237 can be averaged, thereby enabling a more specific impedance adjustment.

It is apparent that the present invention is not limited to the above embodiments, but may be modified and changed without departing from the scope and spirit of the invention.

What is claimed is:

1. A decoder circuit configured to output an analog voltage signal according to input digital data, comprising:
   an operational amplifier having a plurality of input differential pairs, the operational amplifier configured to generate an output voltage by interpolating input voltages applied to the plurality of input differential pairs;
   a first selection circuit configured to select the input voltages applied to the plurality of input differential pairs from the reference voltages according to the input digital data; and
   a compensation unit configured to suppress a fluctuation in a transient variation characteristic of the input voltages applied to the plurality of input differential pairs depending on a selection of the input voltages by the first selection circuit in a case at least one voltage level among the reference voltages is changed.

2. The decoder circuit according to claim 1, further comprising D/A converters each configured to determine an output voltage level according to the input digital data and output as one of the reference voltages,
   wherein the compensation unit operates so that each impedance of a load connected to each output of the D/A converters to be constant or within a predetermined range regardless of the selection of the input voltages to the plurality of input differential pairs by the first selection circuit.

3. The decoder circuit according to claim 1, further comprising D/A converters each configured to determine an output voltage level according to the input digital data and output as one of the reference voltages, wherein the compensation unit comprises:
   dummy loads; and
   a second selection circuit configured to switch each of an electrostatic capacitance of the dummy loads connected with each output of the D/A converters so that a load capacitance connected with each output of the D/A converters is constant or within a predetermined range regardless of the selection of the input voltages to the plurality of input differential pairs by the first selection circuit.

4. The decoder circuit according to claim 1, further comprising D/A converters each configured to determine an output voltage level according to the digital data and output as one of the reference voltages, wherein the compensation unit comprises:
   a plurality of capacitors; and
   a second selection circuit configured to select a combination of the plurality of capacitors connected with each output of the D/A converters according to the digital data.

5. The decoder circuit according to claim 3, wherein an internal resistance of the second selection circuit is configured so that a resistance value of each load connected to each output of the D/A converters is to be constant or within a predetermined range regardless of the selection of the input voltages to the plurality of input differential pairs by the first selection circuit.

6. The decoder circuit according to claim 4, wherein an internal resistance of the second selection circuit is configured so that a resistance value of each load connected to each output of the D/A converters is to be constant or within a predetermined range regardless of the selection of the input voltages to the plurality of input differential pairs by the first selection circuit.

7. The decoder circuit according to claim 3, wherein the first and the second selection circuits comprise analog switches and analog switches comprising the first selection circuit and analog switches forming the second selection circuit comprise a same number and a same size.

8. The decoder circuit according to claim 4, wherein the first and the second selection circuits comprise analog switches and analog switches comprising the first selection circuit and analog switches forming the second selection circuit comprise a same number and a same size.

9. The decoder circuit according to claim 4, wherein the plurality of capacitors comprise a plurality of transistors having same characteristics as input transistors forming the plurality of input differential pairs, and
wherein the plurality of transistors are biased in the same way as the input transistors.

10. A driving circuit for display device comprising a plurality of the decoder circuits of claim 1 to drive a display panel.

11. A display device, comprising:
a driving circuit including a plurality of the decoder circuit of claim 1; and
an active matrix type display panel driven by outputs from the plurality of the decoder circuits.

12. A decoder circuit configured to output an interpolated voltage signal by selectively connecting one of a plurality of analog power supply outputs with each of input terminals included in an operational amplifier, the decoder circuit comprising:
an impedance device group having a plurality of impedance devices, each impedance value of the plurality of impedance devices being almost equal to one of an impedance value between each of the plurality of analog power supply outputs and the plurality of input terminals and a total impedance value of any combination thereof; and
a compensation unit configured to maintain each load impedance of the plurality of analog power supply outputs to be within a predetermined range by selectively connecting the plurality of impedance devices with the analog power supply outputs according to a selection of the analog power supply outputs connected to the plurality of input terminals.

13. The decoder circuit according to claim 1, further comprising:
a first D/A converter configured to determine an output voltage level according to the input digital data and output a first reference voltage; and
a second D/A converter configured to determine an output voltage level according to the input digital data and output a second reference voltage.

14. The decoder circuit according to claim 13, wherein the first selection circuit determines how much of the first reference voltage and the second reference voltage are applied to the operational amplifier.

15. A decoder circuit configured to output an analog voltage signal according to input digital data, comprising:
a plurality of digital to analog converters configured to output reference voltages based on the input digital data;
a selection circuit configured to receive the output reference voltages and to selectively output the output reference voltages to a compensation unit; and
an operational amplifier comprising a plurality of input differential pairs to receive the output reference voltages, the operational amplifier configured to generate an interpolated output voltage by interpolating the voltages applied to the plurality of input differential pairs,
wherein the compensation unit suppresses a fluctuation of voltage in the output voltage, the compensation unit including a plurality of capacitors associated with the DA converters.

16. The decoder circuit according to claim 15, wherein the selection circuit includes a plurality of switch groups, each switch of a switch group being associated with an output of a respective one of the plurality of digital to analog converters, and
wherein the selection circuit switches one switch of each of the plurality of switch groups to be connected to the compensation unit.

17. The decoder circuit according to claim 15, wherein the selection circuit comprises a switch associated with a respective output of the plurality of digital to analog converters associated with a respective input to the compensation unit, and
wherein the selection circuit is configured to operate complimentarily to connect one of the respective outputs to an associated input of the compensation unit.

18. The decoder circuit according to claim 15, further comprising an amplifier input switching unit associated with the plurality of digital to analog converters and configured to receive the output reference voltages and to selectively output the voltages to the operational amplifier,
wherein each output reference voltage of the plurality of digital to analog converters is jointly output to the amplifier input switching unit and the selection circuit.

19. The decoder circuit according to claim 18, wherein the compensation circuit comprises a plurality of capacitors, each of the capacitors associated with a respective output from the selection circuit, and
wherein a capacitance for each of the plurality of capacitors is the same as a respective load capacitance of the operational amplifier with respect to the plurality of digital to analog converters.

20. The decoder circuit according to claim 18, wherein the electrostatic capacitances for each of the plurality of capacitors form respective input differential pairs with a respective input transistor of the operational amplifier, and
wherein the respective electrostatic capacitances are the same as load capacitances for each respective input transistor input into the operational amplifier.

* * * * *